United States Patent
French et al.

(10) Patent No.: US 7,551,907 B2
(45) Date of Patent: Jun. 23, 2009

(54) DIGITAL AUTOMATIC GAIN CONTROL WITH PARALLEL/SERIAL INTERFACE FOR MULTIPLE ANTENNA ULTRA WIDEBAND OFDM SYSTEM

(75) Inventors: Catherine A. French, Olympia, WA (US); Ruoyang Lu, Milpitas, CA (US); Jayesh Desai, Milpitas, CA (US); Can Tri Nguyen, Santa Clara, CA (US); Hung C. Nguyen, Milpitas, CA (US); John Tero, Saratoga, CA (US)

(73) Assignee: Sigma Designs, Inc., Milpitas, CA (US)

( * ) Notice: Subject to any disclaimer, the term of this patent is extended or adjusted under 35 U.S.C. 154(b) by 548 days.

(21) Appl. No.: 11/423,145

(22) Filed: Jun. 8, 2006

(65) Prior Publication Data

US 2007/0053451 A1    Mar. 8, 2007

Related U.S. Application Data

(60) Provisional application No. 60/713,652, filed on Sep. 2, 2005, provisional application No. 60/749,022, filed on Dec. 8, 2005.

(51) Int. Cl.
*H04Q 7/00* (2006.01)
(52) U.S. Cl. .................. 455/234.1; 455/226.2; 370/332
(58) Field of Classification Search ................. 455/132, 455/136, 230, 232.1, 234.2, 245.2, 226.2, 455/234.1; 375/345; 370/252, 318, 320, 370/321, 328, 335, 342
See application file for complete search history.

(56) References Cited

U.S. PATENT DOCUMENTS

| 7,027,530 | B2 * | 4/2006 | McFarland et al. | 375/341 |
|---|---|---|---|---|
| 7,212,798 | B1 * | 5/2007 | Adams et al. | 455/251.1 |
| 7,260,374 | B2 * | 8/2007 | Lee et al. | 455/234.1 |
| 7,304,969 | B2 * | 12/2007 | Ryan et al. | 370/332 |
| 2003/0162518 | A1 * | 8/2003 | Baldwin et al. | 455/253.2 |
| 2006/0153060 | A1 * | 7/2006 | Cho | 370/208 |
| 2007/0058739 | A1 * | 3/2007 | Aytur et al. | 375/260 |

OTHER PUBLICATIONS

Lovrich, A., G. Troullinos, and R. Chirayil, "An All Digital Automatic Gain Control," 1988 International Conference on Acoustics, Speech, and Signal Processing, Apr. 1998, vol. 3, pp. 1734-1737.
Tavares, G. N., and M. S. Piedade, "High Performance Algorithms for Digital Signal Processing AGC," IEEE International Symposium on Circuits and Systems, May 1990, vol. 2, pp. 1529-1532.
Heiskala, J., and J. Terry. OFDM Wireless LANs: A Theoretical and Practical Guide, SAMS Publishing, Indianapolis, Indiana, Sep. 2002, p. 50.

* cited by examiner

*Primary Examiner*—Blane J Jackson
(74) *Attorney, Agent, or Firm*—Aaron Wininger; Nixon Peabody LLP

(57) ABSTRACT

The invention enables automatic gain control in ultra wideband applications over multiple channels and frequency bands.

18 Claims, 11 Drawing Sheets

900

910

Time Frequency Code 1

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 1 | 2 | 3 | 1 | 2 | 3 | 1 | 2 | 3 | 1 | 2 | 3 | 1 |
| action by AGC | none | E2 | S2 | E1 | S1 | E3 | S3 | E2 | S2 | E1 | S1 | E3 | S3 |

Time Frequency Code 2

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 1 | 3 | 2 | 1 | 3 | 2 | 1 | 3 | 2 | 1 | 3 | 2 | 1 |
| action by AGC | none | E3 | S3 | E1 | S1 | E2 | S2 | E3 | S3 | E1 | S1 | E2 | S2 |

Time Frequency Code 3

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 1 | 1 | 2 | 2 | 3 | 3 | 1 | 1 | 2 | 2 | 3 | 3 | 1 |
| action by AGC | none | E1 | S1 | E2 | S2 | E3 | S3 | E1 | S1 | E2 | S2 | E3 | S3 |

Time Frequency Code 4

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 1 | 1 | 3 | 3 | 2 | 2 | 1 | 1 | 3 | 3 | 2 | 2 | 1 |
| action by AGC | none | E1 | S1 | E3 | S3 | E2 | S2 | E1 | S1 | E3 | S3 | E2 | S2 |

Time Frequency Code 5

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 1 | 1 | 1 | 1 | 1 | 1 | 1 | 1 | 1 | 1 | 1 | 1 | 1 |
| action by AGC | none | E1 | S1 | none | none | none | none | E1 | S2 | none | none | none | none |

Time Frequency Code 6

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 2 | 2 | 2 | 2 | 2 | 2 | 2 | 2 | 2 | 2 | 2 | 2 | 2 |
| action by AGC | none | E2 | S2 | none | none | none | none | E2 | S2 | none | none | none | none |

Time Frequency Code 7

| symbol number | 1 | 2 | 3 | 4 | 5 | 6 | 7 | 8 | 9 | 10 | 11 | 12 | 13 |
|---|---|---|---|---|---|---|---|---|---|---|---|---|---|
| frequency band | 3 | 3 | 3 | 3 | 3 | 3 | 3 | 3 | 3 | 3 | 3 | 3 | 3 |
| action by AGC | none | E3 | S3 | none | none | none | none | E3 | S3 | none | none | none | none |

Time Frequency Code 1

| symbol number | 60+n18 | 61+n18 | 62+n18 | 63+n18 | 64+n18 | 65+n18 |
|---|---|---|---|---|---|---|
| frequency band | 1 | 2 | 3 | 1 | 2 | 3 |
| action by AGC | E1 | S1 | E3 | S3 | E2 | S2 |

Time Frequency Code 2

| symbol number | 60+n18 | 61+n18 | 62+n18 | 63+n18 | 64+n18 | 65+n18 |
|---|---|---|---|---|---|---|
| frequency band | 1 | 3 | 2 | 1 | 3 | 2 |
| action by AGC | E1 | S1 | E2 | S2 | E3 | S3 |

Time Frequency Code 3

| symbol number | 60+n18 | 61+n18 | 62+n18 | 63+n18 | 64+n18 | 65+n18 |
|---|---|---|---|---|---|---|
| frequency band | 1 | 1 | 2 | 2 | 3 | 3 |
| action by AGC | E1 | S1 | E2 | S2 | E3 | S3 |

Time Frequency Code 4

| symbol number | 60+n18 | 61+n18 | 62+n18 | 63+n18 | 64+n18 | 65+n18 |
|---|---|---|---|---|---|---|
| frequency band | 1 | 1 | 3 | 3 | 2 | 2 |
| action by AGC | E1 | S1 | E3 | S3 | E2 | S2 |

Time Frequency Code 5

| symbol number | 60+n18 | 61+n18 | 62+n18 | 63+n18 | 64+n18 | 65+n18 |
|---|---|---|---|---|---|---|
| frequency band | 1 | 1 | 1 | 1 | 1 | 1 |
| action by AGC | E1 | S1 | none | none | none | none |

Time Frequency Code 6

| symbol number | 60+n18 | 61+n18 | 62+n18 | 63+n18 | 64+n18 | 65+n18 |
|---|---|---|---|---|---|---|
| frequency band | 2 | 2 | 2 | 2 | 2 | 2 |
| action by AGC | E2 | S2 | none | none | none | none |

Time Frequency Code 7

| symbol number | 60+n18 | 61+n18 | 62+n18 | 63+n18 | 64+n18 | 65+n18 |
|---|---|---|---|---|---|---|
| frequency band | 3 | 3 | 3 | 3 | 3 | 3 |
| action by AGC | E3 | S3 | none | none | none | none |

$A = F_1(E)$ Table Lookup
(Lookup values in decimal; address 0 in upper left; address 255 in lower right.)

| 18 | 10 | 7 | 5 | 4 | 3 | 2 | 1 | 0 | 0 | -1 | -1 | -1 | -2 | -2 | -3 |
|---|---|---|---|---|---|---|---|---|---|---|---|---|---|---|---|
| -3 | -3 | -3 | -4 | -4 | -4 | -4 | -4 | -5 | -5 | -5 | -5 | -5 | -5 | -6 | -6 |
| -6 | -6 | -6 | -6 | -6 | -7 | -7 | -7 | -7 | -7 | -7 | -7 | -7 | -7 | -8 | -8 |
| -8 | -8 | -8 | -8 | -8 | -8 | -8 | -8 | -8 | -9 | -9 | -9 | -9 | -9 | -9 | -9 |
| -9 | -9 | -9 | -9 | -9 | -10 | -10 | -10 | -10 | -10 | -10 | -10 | -10 | -10 | -10 | -10 |
| -10 | -10 | -10 | -11 | -11 | -11 | -11 | -11 | -11 | -11 | -11 | -11 | -11 | -11 | -11 | -11 |
| -11 | -12 | -12 | -12 | -12 | -12 | -12 | -12 | -12 | -12 | -12 | -12 | -12 | -12 | -12 | -12 |
| -13 | -13 | -13 | -13 | -13 | -13 | -13 | -13 | -13 | -13 | -13 | -13 | -13 | -13 | -13 | -14 |
| -14 | -14 | -14 | -14 | -14 | -14 | -14 | -14 | -14 | -14 | -14 | -14 | -14 | -14 | -15 | -15 |
| -15 | -15 | -15 | -15 | -15 | -15 | -15 | -15 | -15 | -15 | -15 | -16 | -16 | -16 | -16 | -16 |
| -16 | -16 | -16 | -16 | -16 | -16 | -16 | -16 | -17 | -17 | -17 | -17 | -17 | -17 | -17 | -17 |
| -17 | -17 | -17 | -18 | -18 | -18 | -18 | -18 | -18 | -18 | -18 | -18 | -18 | -18 | -18 | -19 |
| -19 | -19 | -19 | -19 | -19 | -19 | -19 | -19 | -20 | -20 | -20 | -20 | -20 | -20 | -20 | -20 |
| -20 | -21 | -21 | -21 | -21 | -21 | -21 | -21 | -21 | -22 | -22 | -22 | -22 | -22 | -22 | -22 |
| -23 | -23 | -23 | -23 | -23 | -23 | -24 | -24 | -24 | -24 | -24 | -24 | -25 | -25 | -25 | -25 |
| -25 | -25 | -26 | -26 | -26 | -26 | -26 | -27 | -27 | -27 | -27 | -28 | -28 | -28 | -28 | -29 |

$GC = F_2(G)$ and $G_{diff} = F_3(G)$ Lookup Table, Ideal
(in hexidecimal)

| G | $G_{diff}$ | GC | | G | $G_{diff}$ | GC |
|---|---|---|---|---|---|---|
| 00 | 0 | 00 | | 10 | 0 | 10 |
| 01 | 0 | 01 | | 11 | 0 | 11 |
| 02 | 0 | 02 | | 12 | 0 | 12 |
| 03 | 0 | 03 | | 13 | 0 | 13 |
| 04 | 0 | 04 | | 14 | 0 | 14 |
| 05 | 0 | 05 | | 15 | 0 | 15 |
| 06 | 0 | 06 | | 16 | 0 | 16 |
| 07 | 0 | 07 | | 17 | 0 | 17 |
| 08 | 0 | 08 | | 18 | 0 | 18 |
| 09 | 0 | 09 | | 19 | 0 | 19 |
| 0A | 0 | 0A | | 1A | 0 | 1A |
| 0B | 0 | 0B | | 1B | 0 | 1B |
| 0C | 0 | 0C | | 1C | 0 | 1C |
| 0D | 0 | 0D | | 1D | 0 | 1D |
| 0E | 0 | 0E | | 1E | 0 | 1E |
| 0F | 0 | 0F | | 1F | 0 | 1F |

GC = F₂(G) and G$_{diff}$ = F₃(G) Lookup Table, Non-ideal
(in hexidecimal)

| G | G$_{diff}$ | GC | | G | G$_{diff}$ | GC |
|----|----|----|---|----|----|----|
| 00 | 2 | 00 | | 10 | 0 | 0A |
| 01 | 1 | 00 | | 11 | 0 | 0B |
| 02 | 0 | 00 | | 12 | 0 | 0C |
| 03 | 7 | 00 | | 13 | 0 | 0D |
| 04 | 1 | 01 | | 14 | 0 | 0E |
| 05 | 0 | 01 | | 15 | 0 | 0F |
| 06 | 7 | 01 | | 16 | 0 | 10 |
| 07 | 0 | 02 | | 17 | 0 | 11 |
| 08 | 0 | 02 | | 18 | 0 | 12 |
| 09 | 0 | 03 | | 19 | 0 | 13 |
| 0A | 0 | 04 | | 1A | 0 | 14 |
| 0B | 0 | 05 | | 1B | 0 | 15 |
| 0C | 0 | 06 | | 1C | 0 | 16 |
| 0D | 0 | 07 | | 1D | 0 | 18 |
| 0E | 0 | 08 | | 1E | 0 | 1B |
| 0F | 0 | 09 | | 1F | 0 | 1F |

DIGITAL AUTOMATIC GAIN CONTROL WITH PARALLEL/SERIAL INTERFACE FOR MULTIPLE ANTENNA ULTRA WIDEBAND OFDM SYSTEM

PRIORITY REFERENCE TO PRIOR APPLICATIONS

This application claims benefit of and incorporates by reference U.S. patent application Ser. No. 60/713,652, entitled "Digital Automatic Gain Control for Multiple Antenna Ultra Wideband OFDM System," filed on Sep. 2, 2005, and U.S. patent application Ser. No. 60/749,022, entitled "AGC Parallel/Serial Interface," filed on Dec. 8, 2005.

TECHNICAL FIELD

This invention relates generally to wireless communications, and more particularly, but not exclusively, provides a system and method for automatic gain control.

BACKGROUND

The received signal energy in a wireless system varies widely depending on transmitted power, multipath effects, and losses that occur during transmission. At the same time, the signal processing blocks within a receiver require a fairly precise amount of energy in order to produce the best performance. Thus it is essential that a wireless receiver include an automatic gain control (AGC) mechanism.

Here we describe a novel AGC method for the multiband orthogonal frequency division multiplexed (OFDM) system described in one of the physical layer standards proposed for IEEE 802.15.3a Personal Area Networks. The proposed standard comes from the WiMedia Alliance and can be found on their website: www.wimedia.org. Some aspects of the WiMedia standard are described here to aid understanding of the present invention.

In the WiMedia standard, packets of data for radio transmission include a 30-symbol preamble, a 12-symbol header, and a payload of variable length containing user information. Each symbol within a packet has duration 312.5 ns. The standard allows for multi-user transmission by defining a number of frequency bands and frequency hopping patterns that use those bands. As an example, the mandatory portion of the standard specifies 3 frequency bands as follows:

TABLE I

| Band Number | Frequency Range (GHz) |
|---|---|
| 1 | 3.168-3.696 |
| 2 | 3.696-4.224 |
| 3 | 4.224-4.752 |

The standard allows for 7 hopping patterns so that multiple users can utilize these 3 bands simultaneously. The hopping patterns are as follows:

TABLE II

| TFC | Frequency Hopping in Pattern (band numbers) | | | | | |
|---|---|---|---|---|---|---|
| 1 | 1 | 2 | 3 | 1 | 2 | 3 |
| 2 | 1 | 3 | 2 | 1 | 3 | 2 |
| 3 | 1 | 1 | 2 | 2 | 3 | 3 |
| 4 | 1 | 1 | 3 | 3 | 2 | 2 |
| 5 | 1 | 1 | 1 | 1 | 1 | 1 |
| 6 | 2 | 2 | 2 | 2 | 2 | 2 |
| 7 | 3 | 3 | 3 | 3 | 3 | 3 |

For example, for time frequency code (TFC) equal to 1, the first symbol of a packet is sent in band 1, the second symbol in band 2, the third symbol in band 3, the forth symbol in band 1, and so on. The patterns shown repeat every 6 symbols.

There are several challenges associated with designing an AGC for the particular system in the WiMedia standard. First, the initial AGC adjustments need to be accurate. Second, they need to occur as quickly as possible and within the preamble of the packet so that all operations that depend upon gain—such as channel equalization—achieve optimum performance.

As such, a new automatic gain control is needed.

SUMMARY

Embodiments of the present invention solve the accuracy issue by adjusting each frequency band separately using a single energy lookup table. The speed issue is addressed in that the present design requires only two adjustments for each band. A low-noise amplifier (LNA) must also be controlled by the AGC, and the present design integrates the LNA control into the two adjustments per band. Finally, embodiments of the present invention provide a single AGC method that works regardless of which hopping pattern is in use.

In the present invention, the AGC computations are performed in a digital portion of the system based on the energy observed at the output of an analog-to-digital converter (ADC). The desired gain adjustments are then fed back to the analog amplifiers, thus adjusting the gain at the input to the ADC. Locating the AGC calculations in the digital portion of the system helps to simplify the analog design, which is often the most challenging part to implement. Feeding back the gain information to the analog filters ensures that the ADC input gain is optimized.

One goal of the AGC design is to provide flexibility so that the analog system tolerances can be loosened as much as possible in order to reduce the complexity and cost of the analog design. The present invention achieves this goal by allowing for programmable gain codes to the variable gain amplifiers (VGAs) in the analog portion of the design that can be set after the analog part is fabricated and measured. The AGC presented here also allows for a variable target gain that can adjusted based on system conditions and set as the system is assembled and tested. Alternatively, the target gain can be adjusted on the fly based on measured signal to noise ratio or other parameters. Finally, adjacent AGC adjustments in the present invention are designed to occur far enough apart so that the analog amplifiers are able to settle before the next measurement for adjustment takes place.

Another consideration for the present design is that it is to be used as part of a multiple antenna system that provides receiver diversity for improved system performance. In an embodiment, there are 3 receiving antennas that may all experience different channel energy. Embodiments of the present invention allow for AGC adjustment on each of 3 antennas/channels in addition to the different adjustments on 3 frequency bands. Thus, the total number of entities to adjust is 9. In order to limit the number of connections between the digital AGC and the analog amplifiers, a parallel/serial interface is used to transfer the 9 gain codes and LNA control codes in an efficient manner. Because of the time that this parallel to serial conversion takes, special considerations are needed in the AGC method, as described further below, in order to ensure that the adjustments are timely and accurate.

The present invention includes an initial AGC adjustment (preamble AGC) and an optional periodic adjustment within a packet during the payload (tracking AGC). Both the preamble AGC and the tracking AGC use the same basic method. The preamble AGC sets the gain prior to channel estimation and ensures that the header has the best possible gain. The tracking AGC sets the gain within the payload and improves performance in the presence of fading within a packet.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 9 includes tables illustrating preamble AGC calculations;

FIG. 10 includes tables illustrating tracking AGC calculations;

FIG. 12 illustrates a lookup table according to an embodiment of the invention;

FIG. 13 illustrates a lookup table according to an embodiment of the invention; and FIG. 14 illustrates a lookup table according to an embodiment of the invention.

DETAILED DESCRIPTION

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
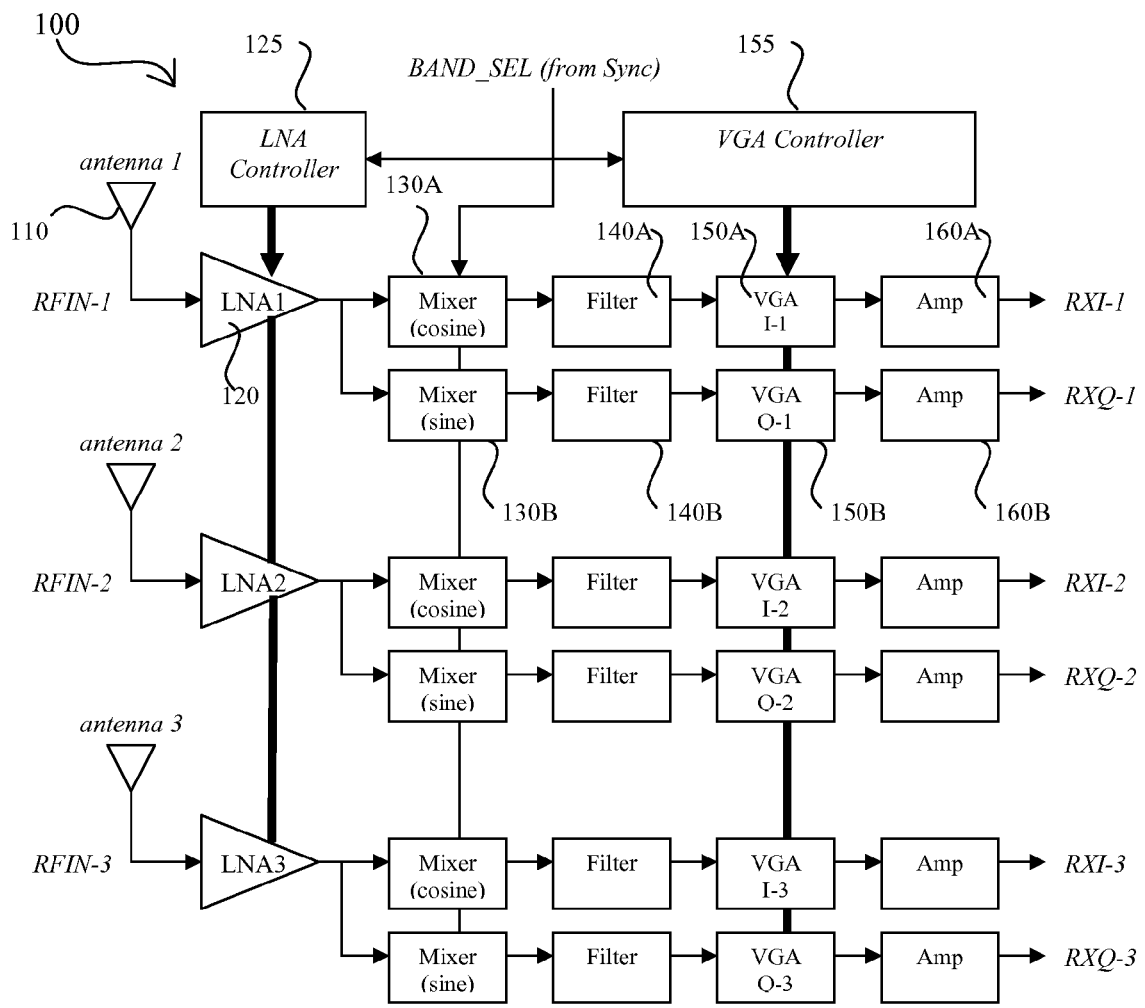
FIG. 1 is a block diagram illustrating the analog receiver blocks of an embodiment of the present invention.

FIG. 1 is a block diagram showing the analog receiver blocks that are controlled by a system 100. Three receiver paths (also known as channels) are shown, one for each receiving antenna. In this invention, automatic gain control is performed independently on each of the channels, allowing for the fact that each antenna may not receive the same energy. Since the AGC function is separate for each channel, embodiments of the invention can have fewer or more than 3 channels. The description that follows is for the first antenna and the first channel; the other channels having a substantially similar structure. A transmitted signal enters the receiving antenna 110, which is coupled to a low noise amplifier (LNA) 120. Each LNA 120 is controlled by a 1-bit signal, LNA_CTRL, which is stored in an LNA controller 125. The signal, LNA_CTRL, determines whether each LNA is on or off. Each LNA 120 is coupled to two mixers 130A, 130B, which are set to the same frequency but are 90 degrees apart in phase. The output of the top mixer in each pair produces the demodulated in-phase or I-channel data stream, and the output of the bottom mixer in each produces the demodulated quadrature or Q-channel data stream. The I- and Q-channel mixers are coupled to lowpass filters 140A, 140B, and the filters are coupled to variable gain amplifiers (VGAs) 150A, 150B. The gain settings of the VGAs are controlled via stored values from the VGA controller 155. Each I/Q pair of VGAs 150A, 150B in a given channel are set to the same gain. The VGA outputs are coupled to identical fixed-gain amplifiers 160A, 160B, producing outputs RXI-1 and RXQ-1. The outputs produced on the other two channels are: RXI-2, RXQ-2, RXI-3, and RXQ-3.

Figure 2:
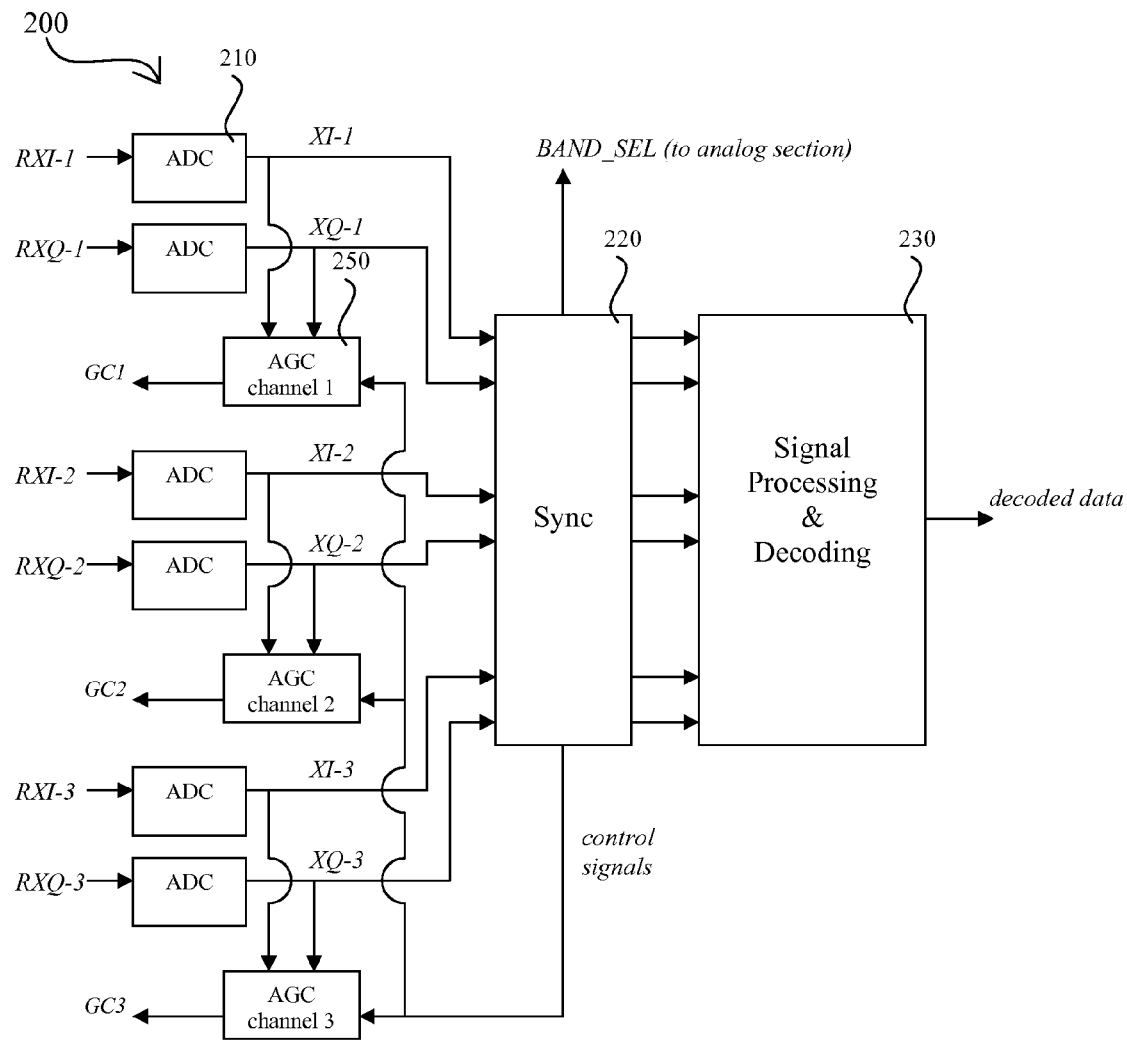
FIG. 2 is a block diagram illustrating digital receiver blocks of an embodiment of the present invention.

FIG. 2, which continues where FIG. 1 left off, is a block diagram showing digital receiver blocks 200 according to an embodiment of the invention. The outputs of the analog block diagram are coupled to six analog-to-digital converters (ADCs) 210. The ADCs are coupled to a synchronizer 220, which detects the presence of a packet, determines its timing, and produces a BAND_SEL signal which selects the frequency band for frequency hopping, and other control signals. The BAND_SEL signal from the synchronizer 220 is coupled to the analog portion of the system 100. The synchronizer output is connected to signal processing and decoding blocks 230 that extract user information from the received packet. These signal processing and coding blocks 230 require specific gain levels for optimum performance, and this gain function is performed by an AGC 250 (FIG. 7), which is the subject of this invention.

In addition to being coupled to the synchronizer, the ADC outputs are also coupled to the AGC blocks 250, with one IQ pair of ADCs 210 coupled to each AGC 250. The synchronizer 220 is coupled to the AGC 250 via control signals that inform the AGC when a packet is starting or ending, thus ensuring that the AGC algorithm comes on at the start of a packet and turns off at the end of a packet. The AGC output that controls the VGA and LNA is called GC1 (for channel 1), and is made up of 3 6-bit signals, GC1_B1, GC1_B2, and GC1_B3 (one for each frequency band). The GC1 signal is coupled to a parallel/serial interface (FIG. 3) to be described shortly, which is used to transfer gain information from the AGC to the VGA.

Figure 3:
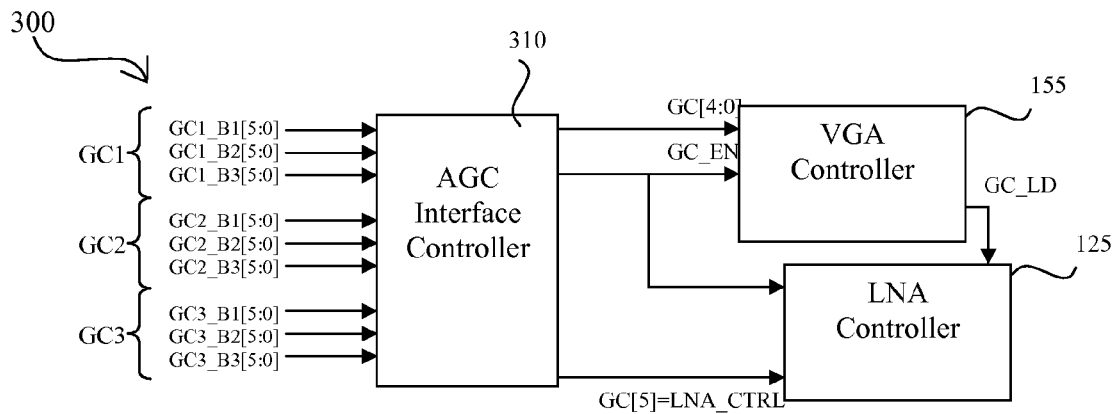
FIG. 3 is a block diagram illustrating a parallel/serial interface.

FIG. 3 is a block diagram of the parallel/serial interface 300. This drawing illustrates how information from the AGC is transferred to registers that are subsequently used to control the VGAs and LNAs. For each AGC adjustment, 9 6-bit gain codes are provided by the AGC for all channels 250 as inputs to the AGC interface controller 310, which accomplishes the parallel-to-serial conversion. The AGC interface controller 310 is coupled to the VGA controller 155 via the 5-bit gain code signal GC[4:0] and the control signal GC_EN. The AGC interface controller 310 is also coupled to the LNA controller 125 via the 1-bit LNA signal GC[5]=LNA_CTRL and the control signal GC_EN. The LNA controller is coupled to the VGA controller via the control signal GC_LD, which is generated inside the VGA controller.

Figure 4A:
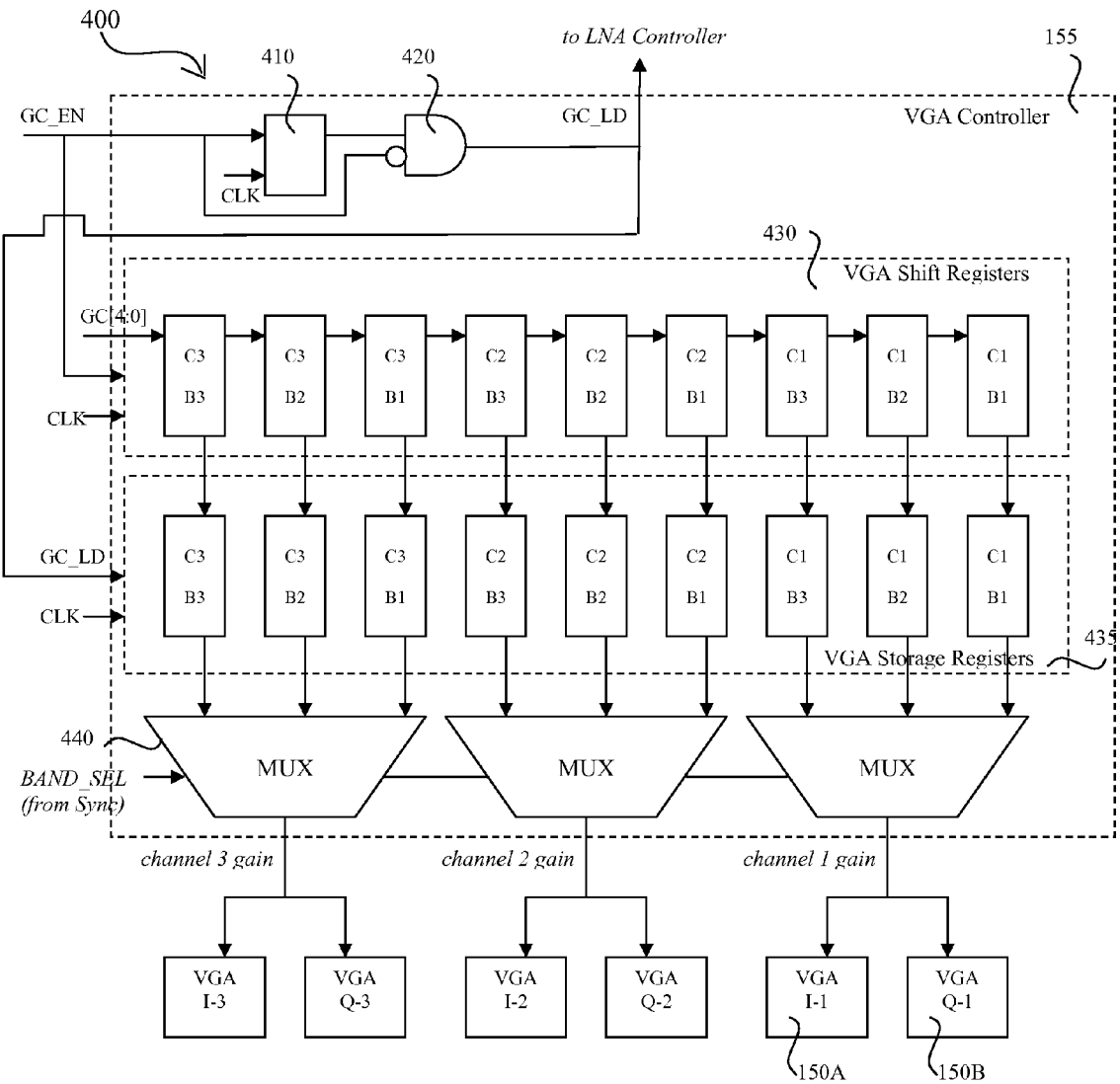
FIG. 4A is a block diagram illustrating a variable gain amplifier (VGA) controller.

FIG. 4A 400 is a block diagram showing the VGA controller 155 and its connections to the VGAs 150A, 150B. The GC_EN input to the VGA controller is coupled to a clocked flip-flop 410, which is coupled to an AND gate 420. The output of the AND gate is another control signal, GC_LD, that is used by the VGA controller 155 and the LNA controller 125. The VGA controller contains VGA shift registers 430, which are coupled to VGA storage registers 435, which are in turn coupled to multiplexers 440. When GC_EN is asserted, the 9 5-bit gain codes from the AGC are shifted serially into the 9 5-bit VGA shift registers 430 via the GC[4:0] inputs. After GC_EN is deasserted, the control signal GC_LD is asserted for one clock in order to load the gain codes from the VGA shift registers 430 into the VGA storage registers 435 that actually control the gain codes into the VGAs. The labels in the VGA shift registers 430 and storage registers 435 indicate which gain code is ultimately stored in each register, with channel 1, band 1 on the far right (first in), and channel 3, band 3 on the far left (last in). The reason for using 9 gain codes and registers is as follows. First, since the system must frequency hop over three bands, and it is possible that the overall gain may be different for each band, there must be three gain settings stored for each receiver channel. Second, because the preferred embodiment is a 3-channel system, each receiver channel may also incorporate a different gain from the other channels. Thus, a total of 9 5-bit registers are required to completely define the receiver gain of the VGAs in the preferred embodiment. If the number of channels were decreased or increased, the number of registers would be adjusted accordingly. Note in FIG. 4A that each I/Q pair of VGAs 150A, 150B is set to the same gain. The gain for each pair is set using a multiplexer (MUX) 440 which selects one of three values stored in the VGA storage registers 435 via the BAND_SEL signal.

Figure 4B:
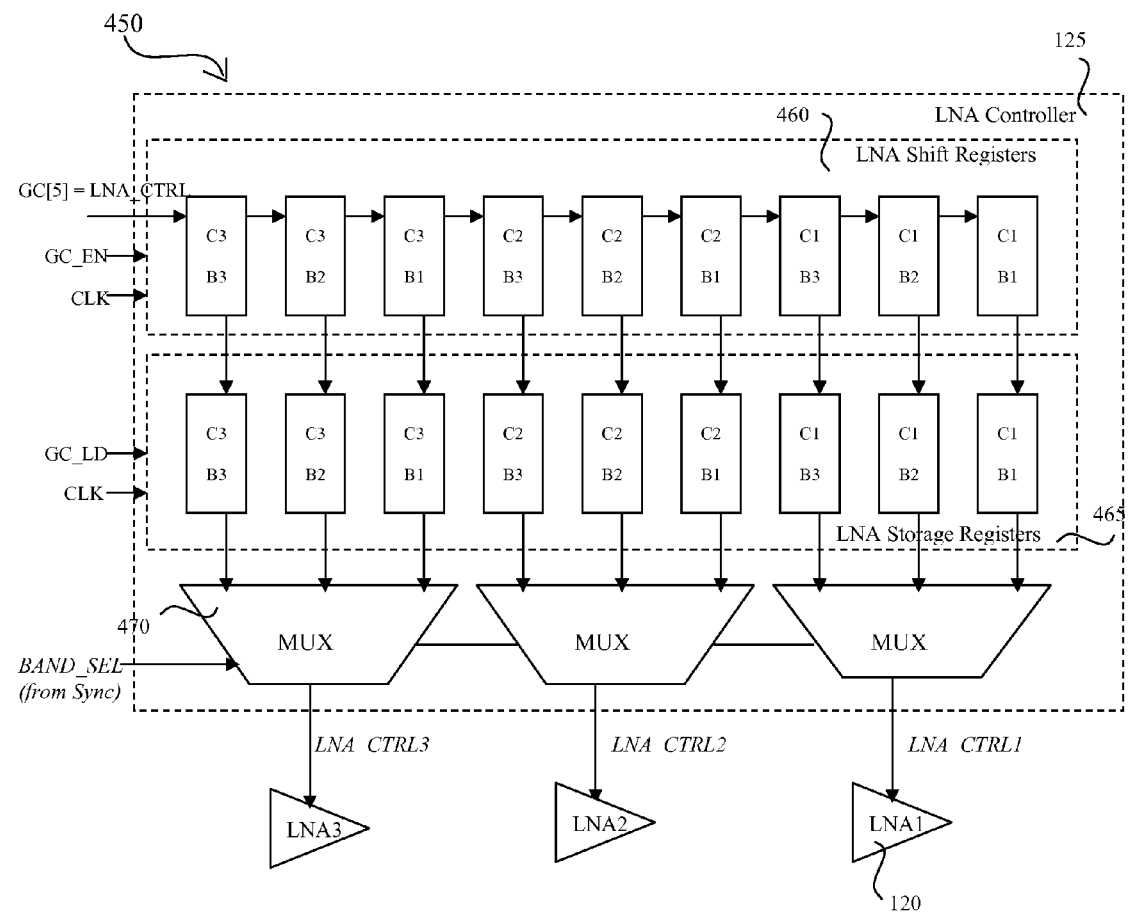
FIG. 4B is a block diagram illustrating a low noise amplifier (LNA) controller.

FIG. 4B 450 is a block diagram showing the LNA controller 125 and its connections to the LNAs 120. The LNA controller contains LNA shift registers 460, which are coupled to LNA storage registers 465, which are in turn coupled to multiplexers 470. When GC_EN is asserted, the 9 1-bit LNA_CTRL signals from the AGC are shifted serially into the 9 1-bit LNA shift registers 460 via the GC[5] input. After GC_EN is deasserted, the control signal GC_LD is asserted for one clock in order to load the LNA control values from the LNA shift registers 460 into the LNA storage registers 465 that actually control the LNAs. The labels in the LNA shift registers 460 and storage registers 465 indicate which LNA control value is ultimately stored in each register, with channel 1, band 1 on the far right (first in), and channel 3, band 3 on the far left (last in). The gain of each LNA 120 is either high or low depending on the 1-bit LNA_CTRL signals coming from each multiplexer (MUX) 470, which selects one of three values stored in the LNA storage registers 465 via the BAND_SEL signal.

Figure 5:
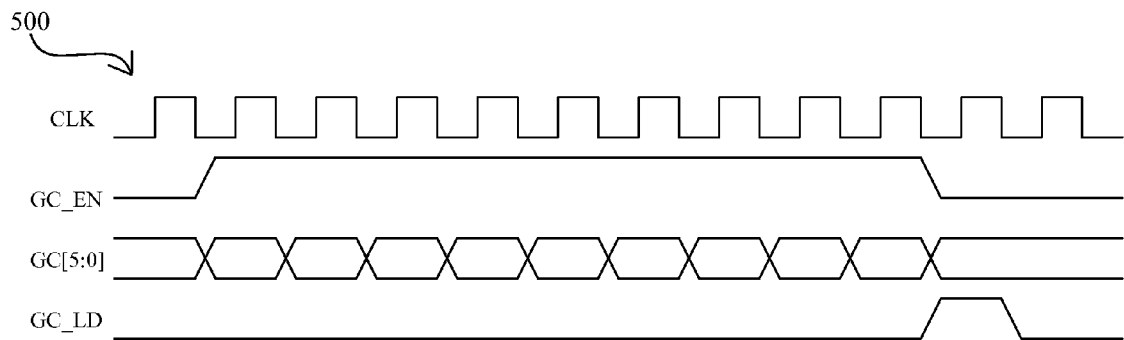
FIG. 5 is a timing diagram of the parallel/serial interface.

FIG. 5 is a timing diagram 500 for the parallel/serial interface 300. The control signal, GC_EN, is asserted for 9 positive edges of CLK in order to shift the 9 6-bit words into the VGA registers shift registers 430 and LNA shift registers 460 via the GC[5:0] bus. After GC_EN is deasserted, the control signal GC_LD is asserted for one clock in order to load the values from the VGA shift registers 430 into the VGA storage registers 435, and to load the values from the LNA shift registers 460 into the LNA storage registers 465.

Figure 6:
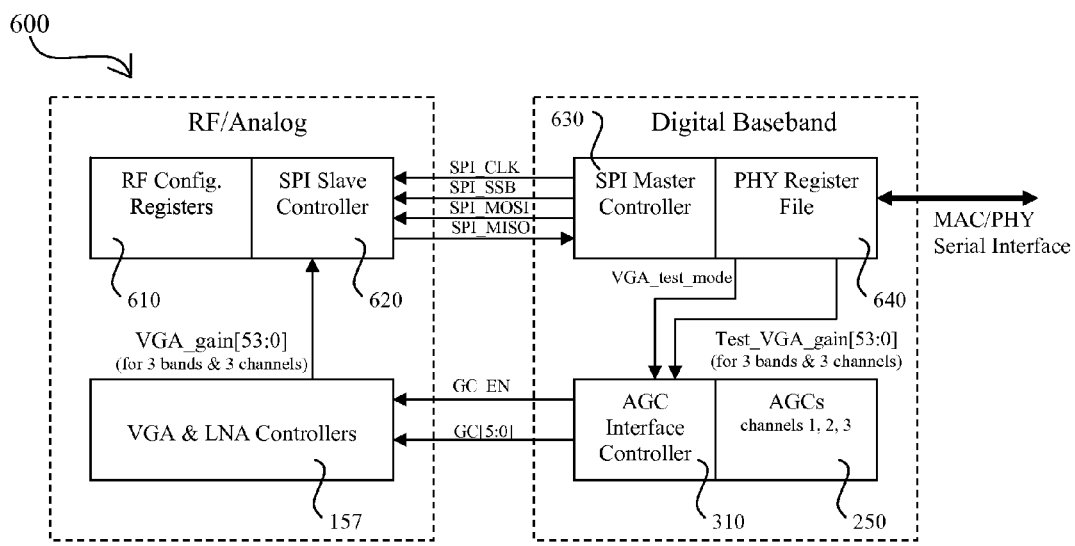
FIG. 6 is a block diagram illustrating an AGC/VGA interface.

FIG. 6 is a block diagram showing the complete AGC/VGA interface 600. This includes the parallel/serial interface 400 connecting the AGC interface controller 310 and the VGA and LNA controllers 157, plus an additional interface called the SPI, or serial parallel interface, which couples the SPI slave controller 620 to the SPI master controller 630. In general the SPI is used for programming and monitoring RF configuration registers 610 in the RF/analog portion of the design, but it can also be used for diagnostic purposes to monitor the contents of the VGA storage registers 435 and LNA storage registers 465. During normal operation of the receiver, the VGA storage registers 435 and LNA storage registers 465 can be monitored by the Media Access Control (MAC) layer through the SPI when the SPI master controller 630 is in VGA gain monitor mode. There is also a VGA test mode which allows the MAC to both write the VGA and LNA registers through the parallel/serial interface 300, and monitor (read) the registers through the SPI.

The analog device serves as the SPI slave 620 where SPI_MOSI is the data input pin, SPI_MOSI is the data output pin, SPI_CLK is the SPI clock pin and SPI_SSB is the slave enable signal. Both the SPI_CLK and SPI_SSB signals are driven by the digital baseband processor, which serves as the SPI master device 630. On the analog slave device 620 there are 12 8-bit SPI registers 610 that control configuration, calibration and test. These registers are daisy-chained to produce a single 96 bit register. In order to read or write to any of the 8-bit registers the entire 96 bits must be shifted through the SPI interface. The beginning and end of the SPI transaction is controlled by the SPI_CK and SPI_SSB signals from the master. An internal power-on-reset resets all data bits in the SPI registers to 0 at power-up. The data in the RF configuration registers 610 is a copy of data written to 12 8-bit SPI registers in the baseband processor, called the PHY register file 640. An additional 8-bit register on the baseband processor determines the direction of the SPI transaction, the SPI clock speed and clock edge polarity for transferring data from the baseband device onto the SPI_MOSI signal line. This is the SPI_Control register, which determines whether the operation is a read or write and whether the data read back comes from the analog device's SPI or VGA and LNA registers. When the VGA and LNA registers are read back through the SPI, the register contents occupy the first 54 bits of the 96 bit stream on SPI_MISO. The remaining 42 bits are ignored.

Figure 7:
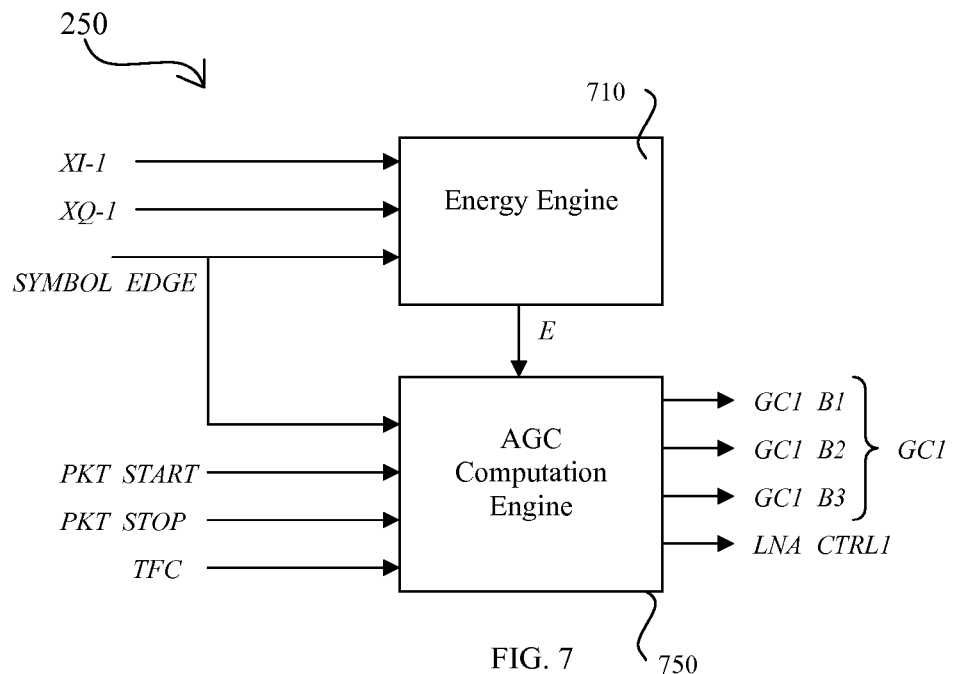
FIG. 7 is a block diagram illustrating the AGC for a channel.

FIG. 7 is a block diagram of the AGC 250 for channel 1. The AGCs for channels 2 and 3 operate the same as for channel 1. The ADC 210 outputs, XI-1 and XQ-1, are coupled to an energy engine 710. The output of the energy engine is coupled to the AGC computation engine 750, which uses the energy to determine adjustments in gain. The synchronizer 220 provides a signal, SYMBOL_EDGE, which is coupled to both the energy engine 710 and the AGC computation engine 750. This signal is used to latch the energy in the energy engine and to determine the symbol number and frequency band in the AGC computation engine 750. Other inputs to the AGC computation engine 750 include the PKT_START and PKT_STOP control signals from the synchronizer 220 indicating the start and end of each packet, respectively, and the time frequency code (TFC) number, which is used to determine the frequency hopping pattern. The AGC computation engine 750 produces gain codes and LNA codes collectively called GC1 to be sent to the parallel/serial interface 300. Equivalent output signals are produced by the AGC computation engines for channels 2 and 3 as well.

Figure 8:
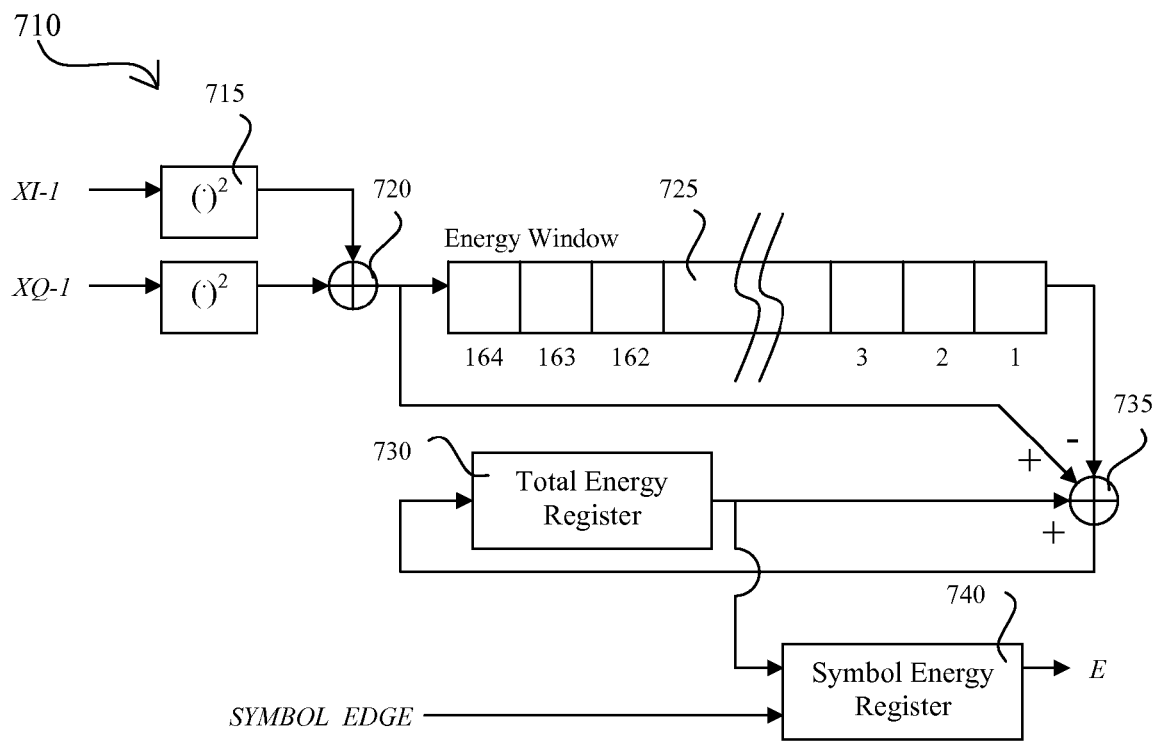
FIG. 8 is a circuit diagram illustrating an energy engine according to an embodiment of the invention.

FIG. 8 is a circuit diagram showing an implementation of the energy engine 710. Outputs from the I and Q ADCs 210 enter squaring devices 715. The squared values enter an adder 720 and are then stored in one cell of an energy window 725. In the preferred embodiment, the energy window contains 164 energy values, but this number could be adjusted as needed depending on the implementation. The energy engine also contains a total energy register 730 which stores the sum of 164 individual energy values. Instead of summing all 164 values on each clock however, the total energy is updated by subtracting the oldest energy value and adding the newest energy value using a second adder 735. The output of the total energy register 730 is coupled to a symbol energy register 740 which stores current total energy whenever a symbol edge occurs, as indicated by the synchronizer 220.

FIG. 9 is a diagram showing when AGC calculations are performed by the AGC computation engine during the preamble portion of a packet, and when gain information is sent to the analog portion of the design via the parallel/serial interface. There are sub-diagrams for each time frequency code. The first sub-diagram 910 will be described in detail, but the other sub-diagrams work in the exactly the same way. In other words, the method shown for TFC=1 works for all of the time frequency codes with appropriate adjustments to band numbers. There are rows indicating symbol number, frequency band, and action by the AGC. Each box to the right of these row headings represents one symbol time. In this diagram, we assume that the AGC calculations begin with the second symbol received. However, the method works for any starting point. At the end of the second symbol as indicated by the synchronizer, the energy of that second symbol is stored as indicated by E2: E stands for energy and 2 indicates band 2. During the third symbol, one pass of the AGC calculations is performed using this stored energy and the results are sent to the VGA and LNA via the parallel/serial interface, as indicated by S2: S stands for sent and the 2 indicates that only the gain values of band 2 are changed although all gain values are resent through the interface. On the fourth and fifth symbols, the process repeats for band 1. On the sixth and seventh symbols, the process repeats for band 3. Then all three bands are adjusted one more time in the same manner. In this way, the energy computation for a given band is always separated from the previous adjustment by at least 4 symbols. This provides sufficient time for the parallel/serial interface 400 to transfer the gain codes and for the VGAs 150A, 150B and LNAs 120 to adjust to the new gain before any additional adjustments are made. In addition, this method works for any of the time frequency codes described in the WiMedia standard as illustrated in the rest of the sub-diagrams in FIG. 9.

FIG. 10 contains the same information as FIG. 9 but for the tracking AGC rather than the preamble AGC 1000. A single adjustment is made in each band every 18 symbols starting with symbol 60. In the figure, n is a non-negative integer. The starting point at symbol 60 was chosen so that tracking adjustments would start several symbols into the payload. The period of 18 symbols was chosen because it was a multiple of the hopping period, equal to 6. However, the exact values for the starting symbol and period of tracking adjustments could be chosen differently in other embodiments.

Figure 11:
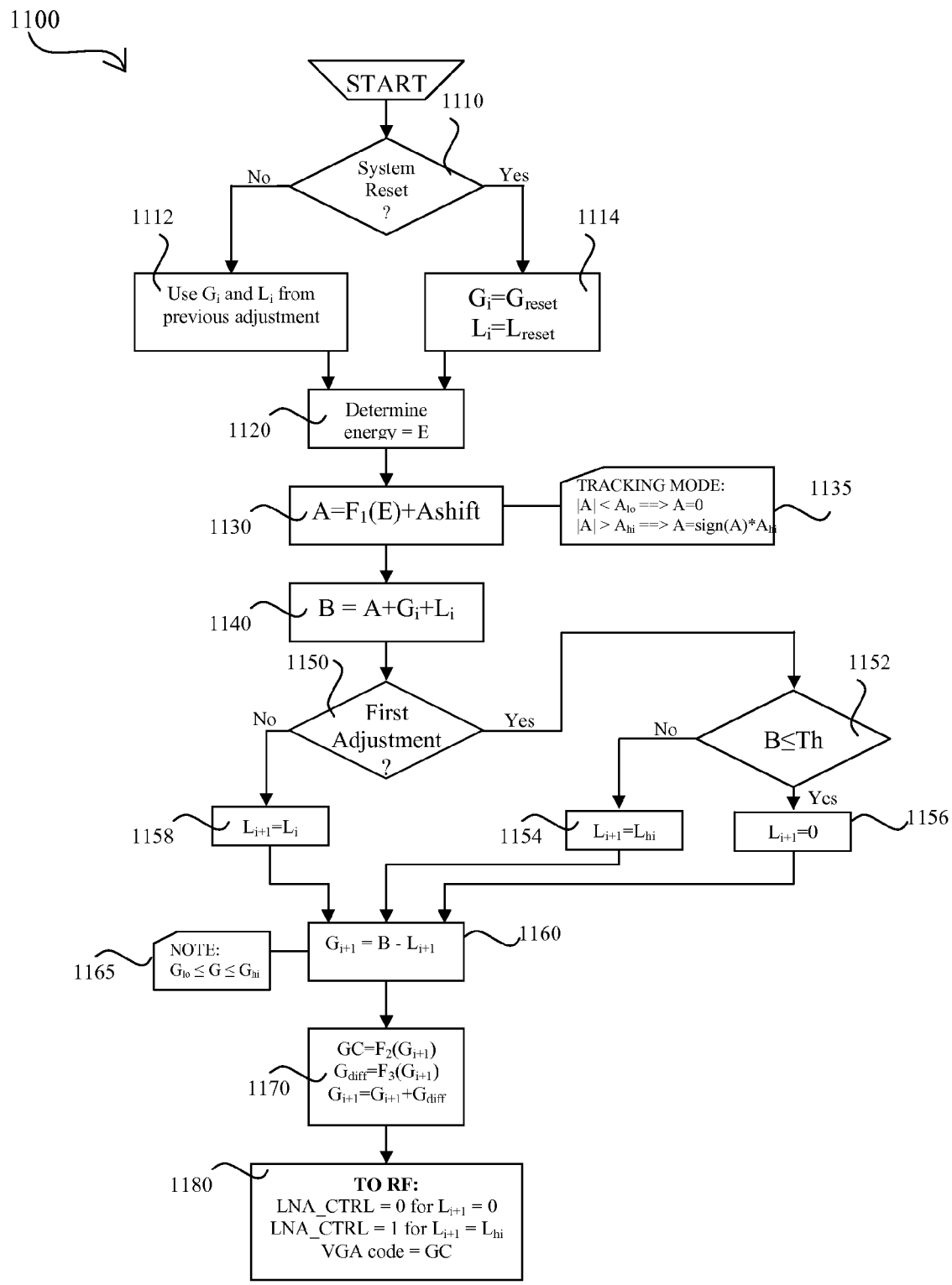
FIG. 11 is a flow chart illustrating a method performed during a single pass of the AGC computation engine for one channel and one band.

FIG. 11 is a flow chart illustrating the operations 1100 performed during a single pass of the AGC computation engine for one channel and one band. The same flow chart is used for both the preamble AGC and the tracking AGC. To start, a test is performed 1110 for system reset. If a reset has occurred, the VGA gain value $G_i$ is set to its reset 1114 value $G_{reset}$, and the LNA gain value is set 1114 to its reset value of $L_{reset}$, both which can be made programmable. In the an embodiment, $G_{reset}$=31 dB, which is the highest gain of the VGA, and $L_{reset}$=15 dB, which is the gain difference between LNA on and LNA off. If no reset has occurred, the VGA and LNA gain values from the previous adjustment are used 1112. Next, the energy of one OFDM symbol is calculated 1120 and stored. In an embodiment, the energy is computed continuously as data is shifted in, so the energy need only be stored (latched) by the AGC at the time indicated by the synchronization block. Then the integer portion of the energy value, E, is used 1130 in the equation $A=F_1(E)+A_{shift}$, where F(E) is a lookup table and $A_{shift}$ is a programmable value that sets the target gain of the AGC. During tracking mode, the value of A is tested 1135 and modified so that it is either $A_{lo}$, 0, or $-A_{lo}$. The value of $A_{lo}$ can be made programmable, with a typical value of 3. This ensures that adjustments do not occur too often, any the gain change is limited to $\pm A_{lo}$ during the payload section of the packet. After computation of A, a second value, B, is computed 1140 as the sum of A, $G_i$ and $L_i$. The value of B is the desired gain of the VGA. In an embodiment of the invention, the next step is to check whether the present adjustment is the first adjustment 1150 in the packet for each antenna/channel. This test can be omitted if it is desired that LNA adjustments occur on every adjustment for every band. However, it is sometimes desirable to limit the toggling of the LNA because of settling time. If the current pass of the AGC is the first adjustment in a packet 1150, a decision is made as to whether the LNA is to be turned on or off. This is accomplished by comparing 1152 B to a threshold, Th, typically around $(L_{hi}+G_{hi})/2$. If B is larger than the threshold, the LNA will be turned on 1154, otherwise it will be off 1156. If the adjustment is not the first one, the LNA gain is unchanged 1158 from the last pass of the AGC. Once the LNA status is determined, the new VGA code, $G_{i+1}$, is computed 1160 as $B-L_{i+1}$. The value of $G_{i+1}$ is then adjusted 1165 to $G_{lo}$ or $G_{hi}$ if it is lower than the minimum allowed VGA gain, or higher than the maximum supported VGA gain, respectively. The high and low values, $G_{lo}$ and $G_{hi}$, can be made programmable so that the AGC can accommodate VGA curves that are non-ideal. The gain code, GC, is then found 1170 using the function $F_2(G_{i+1})$, which can be implemented as a lookup table based on VGA data. In the same lookup table, another value is provided as $G_{diff}=F_3(G_{i+1})$, where $G_{diff}$ is the difference between the desired gain and the gain actually available. The difference is then added to $G_{i+1}$ so that the initial gain will be correct on the next pass of the AGC. The last box in the flow chart 1180 indicates the variables to be sent to the analog portion of the system: the gain code, GC[4:0], and LNA on/off signal, LNA_CTRL, which is also referred to as GC[5] in the parallel/serial interface 300.

FIG. 12 shows an embodiment of the lookup table 1200, $A=F_1(E)$, or Adjustment as a function of Energy. The address for this table ranges from 0-255, and is equal to the rounded integer value of the energy, assuming the samples out of the ADCs are purely fractional. The lookup value is a signed 6-bit integer indicating the adjustment amount, shown in decimal in FIG. 12. The address 0 (energy=0) is in the upper left-hand corner, and the address 255 (energy=255 decimal) in the lower right-hand corner. For example, if E=3 then A=5 from the table. As shown in FIG. 11, the A=F(E) lookup table is made more flexible by allowing for a shift in the table of $A_{shift}$, ranging from 0 through 7 dB. The table was generated for a low energy case, and the higher energy cases are covered by adding $A_{shift}$ to A immediately after the table lookup. Typically, $A_{shift}$ should be set to about 3 dB in the preferred embodiment.

FIG. 13 shows an embodiment of the combined lookup tables 1300 for $GC=F_2(G)$, or Gain Code as a function of VGA gain, and $G_{diff}=F_3(G)$, or gain difference as a function of VGA gain. FIG. 13 is for a perfectly linear ideal VGA characteristic that achieves a range of 0-31 dB in 1 dB increments. The address for this table (in hexadecimal) is, G, the desired VGA gain in dB. The lookup values (in hexadecimal) are, respectively, the gain correction, $G_{diff}$, which is added to G prior to subsequent adjustments, and the gain code, GC, to be sent to the VGA to achieve this gain. The address is 5 bits unsigned, and the lookup value is 8 bits, with the most significant 3 bits equal to $G_{diff}$ (signed) and the least significant 5 bits equal to the gain code, GC (unsigned).

FIG. 14 shows an alternative embodiment of the combined lookup tables 1400 for $GC=F_2(G)$ and $G_{diff}=F_3(G)$ for an example case where the VGA characteristic is non-ideal. A table like this can be created after measuring the actual VGAs in the analog portion of the design, then choosing an average VGA characteristic based on measurements. As an example of how to interpret FIG. 14, suppose that the AGC computes a desired gain of G=6 dB 1410. This produces lookup values of $G_{diff}=7$ and GC=01. GC=01 means that the gain code 01 is the one that gives a gain closest to 6 dB in the non-ideal VGA. $G_{diff}=7$ hex is equivalent to −1 decimal (if $G_{diff}$ is assumed to be 3 bits, twos complement). This means that the gain actually achieved by using GC=01 is really 1 less than 6, or 5 dB.

The foregoing description of the illustrated embodiments of the present invention is by way of example only, and other variations and modifications of the above-described embodiments and methods are possible in light of the foregoing teaching. For example, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. An ultra wideband OFDM receiver, comprising:
    at least one channel comprising an antenna, a low noise amplifier coupled to the antenna and a variable gain amplifier coupled to each mixed and filtered I and Q output of the low noise amplifier;
    a gain controller communicatively coupled to a parallel/serial interface; and
    a calculation engine, which is communicatively coupled to the gain controller, and calculates the gain codes during a preamble portion of a packet;
    wherein the gain controller transmits gain codes for adjusting gain of the variable gain amplifier to the parallel/serial interface, which is further communicatively coupled to a variable gain amplifier controller;
    wherein the gain controller transmits gain codes for adjusting gain of the low noise amplifier to the parallel/serial interface, which is further communicatively coupled to a low noise amplifier controller;
    wherein the gain codes include three gain codes per channel corresponding to frequency hops over three bands per channel;
    wherein the gain codes are based on received energy at each antenna;
    wherein the calculation engine repeatedly calculates the gain codes every set integer number of symbols within a payload portion of the packet.

2. The receiver of claim 1, wherein the controller looks up the adjustment amounts from a first lookup table, the first lookup table having values calibrated for a low target energy.

3. The receiver of claim 2, wherein the adjustment amount is modified after lookup by adding a variable amount for a target energy higher than the low target energy.

4. The receiver of claim 1, wherein the controller looks up the gain codes from a second lookup table, the lookup table having codes calibrated for the receiver.

5. The receiver of claim 1, wherein the repeating is at least a distance apart to enable a parallel/serial interface and an analog portion of the receiver to settle.

6. The receiver of claim 1, wherein the gain controller adjusts the low noise amplifiers of each channel based on the received energy.

7. The receiver of claim 1, wherein the parallel/serial interface shifts the gain code serially into registers of the variable gain amplifier controller.

8. The receiver of claim 1, wherein the parallel/serial interface shifts the gain code serially into registers of the low noise amplifier controller.

9. The receiver of claim 7, wherein a parallel/serial interface is configured to monitor contents of the registers for diagnostic purposes.

10. A method, comprising:
    receiving an ultra wideband signal at least one channel comprising an antenna, a low noise amplifier coupled to the antenna and a variable gain amplifier coupled to each mixed and filtered I and Q output of the low noise amplifier;
    adjusting gain of the variable gain amplifiers of each channel with a gain controller communicatively coupled to a parallel/serial interface;
    calculating the gain codes during a preamble portion of a packet; and
    repeatedly calculating the gain codes every set integer of symbols within a payload portion of the packet;
    wherein the gain controller transmits gain codes for adjusting gain of the variable gain amplifier to the parallel/serial interface further communicatively coupled to a variable gain amplifier controller;
    wherein the gain codes include three gain codes per channel corresponding to frequency hops over three bands per channel;
    wherein the gain codes are based on received energy at each antenna.

11. The method of claim 10, further comprising looking up the adjustment amounts from a first lookup table, the first lookup table having values calibrated for a low target energy.

12. The method of claim 11, wherein the adjustment amount is modified after lookup by adding a variable amount for a target energy higher than the low target energy.

13. The method of claim 10, wherein the controller looks up the gain codes from a second lookup table, the lookup table having codes calibrated for the system.

14. The method of claim 10, wherein the repeating is at least a distance apart to enable a parallel/serial interface and an analog portion of the receiver to settle.

15. The method of claim 10, further comprising adjusting the low noise amplifiers of each channel based on the received energy.

16. The method of claim 10, further comprising shifting the gain code serially into registers of the variable gain amplifier controller.

17. The receiver of claim 10, further comprising shifting the gain code serially into registers of the low noise amplifier controller.

18. The method of claim 16, further comprising monitoring contents of the registers for diagnostic purposes.

* * * * *